(12) United States Patent
Shim et al.

(10) Patent No.: US 8,253,892 B2
(45) Date of Patent: Aug. 28, 2012

(54) LIQUID CRYSTAL DISPLAY AND METHOD FOR MANUFACTURING THE SAME

(75) Inventors: Seung-Hwan Shim, Seongnam-si (KR); Gug-Rae Jo, Asan-si (KR); Sung-Hoon Yang, Seoul (KR); Kap-Soo Yoon, Cheongan-si (KR); Ki-Hun Jeong, Cheongan-si (KR); Jae-Ho Choi, Seoul (KR); Yang-Ho Jung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 347 days.

(21) Appl. No.: 12/547,039

(22) Filed: Aug. 25, 2009

(65) Prior Publication Data

US 2010/0123861 A1      May 20, 2010

(30) Foreign Application Priority Data

Nov. 19, 2008   (KR) ........................ 10-2008-0115037

(51) Int. Cl.
*G02F 1/1335*   (2006.01)

(52) U.S. Cl. ........................................ 349/106

(58) Field of Classification Search ........... 349/106–107
See application file for complete search history.

(56) References Cited

U.S. PATENT DOCUMENTS

| | | | | |
|---|---|---|---|---|
| 5,818,550 | A  | * | 10/1998 | Kadota et al. .................. 349/43 |
| 6,850,311 | B2 |   | 2/2005  | Hasegawa et al. |
| 7,561,229 | B2 | * | 7/2009  | Lee et al. ....................... 349/106 |
| 7,851,797 | B2 | * | 12/2010 | Yamazaki et al. ............... 257/59 |
| 2007/0214977 | A1 | | 9/2007 | Okamoto |

FOREIGN PATENT DOCUMENTS

| | | |
|---|---|---|
| JP | 2000131685 | 5/2000 |
| JP | 2002214595 | 7/2002 |
| JP | 2003270430 | 9/2003 |
| JP | 2004184977 | 7/2004 |
| JP | 2004264513 | 9/2004 |
| JP | 2005241728 | 9/2005 |
| KR | 1020070044315 | 4/2007 |
| KR | 1020070055821 | 5/2007 |
| KR | 100782378 | 11/2007 |
| KR | 1020070119261 | 12/2007 |

\* cited by examiner

*Primary Examiner* — James Dudek
(74) *Attorney, Agent, or Firm* — Cantor Colburn LLP

(57) ABSTRACT

A liquid crystal display includes; a first substrate, a gate line and a data line disposed on the first substrate, a color filter including protrusions and depressions aligned with the data line, the color filter being disposed on the data line, a pixel electrode disposed on the color filter, a second substrate facing the first substrate, a common electrode disposed on the second substrate, and a liquid crystal layer interposed between the first substrate and the second substrate.

24 Claims, 14 Drawing Sheets

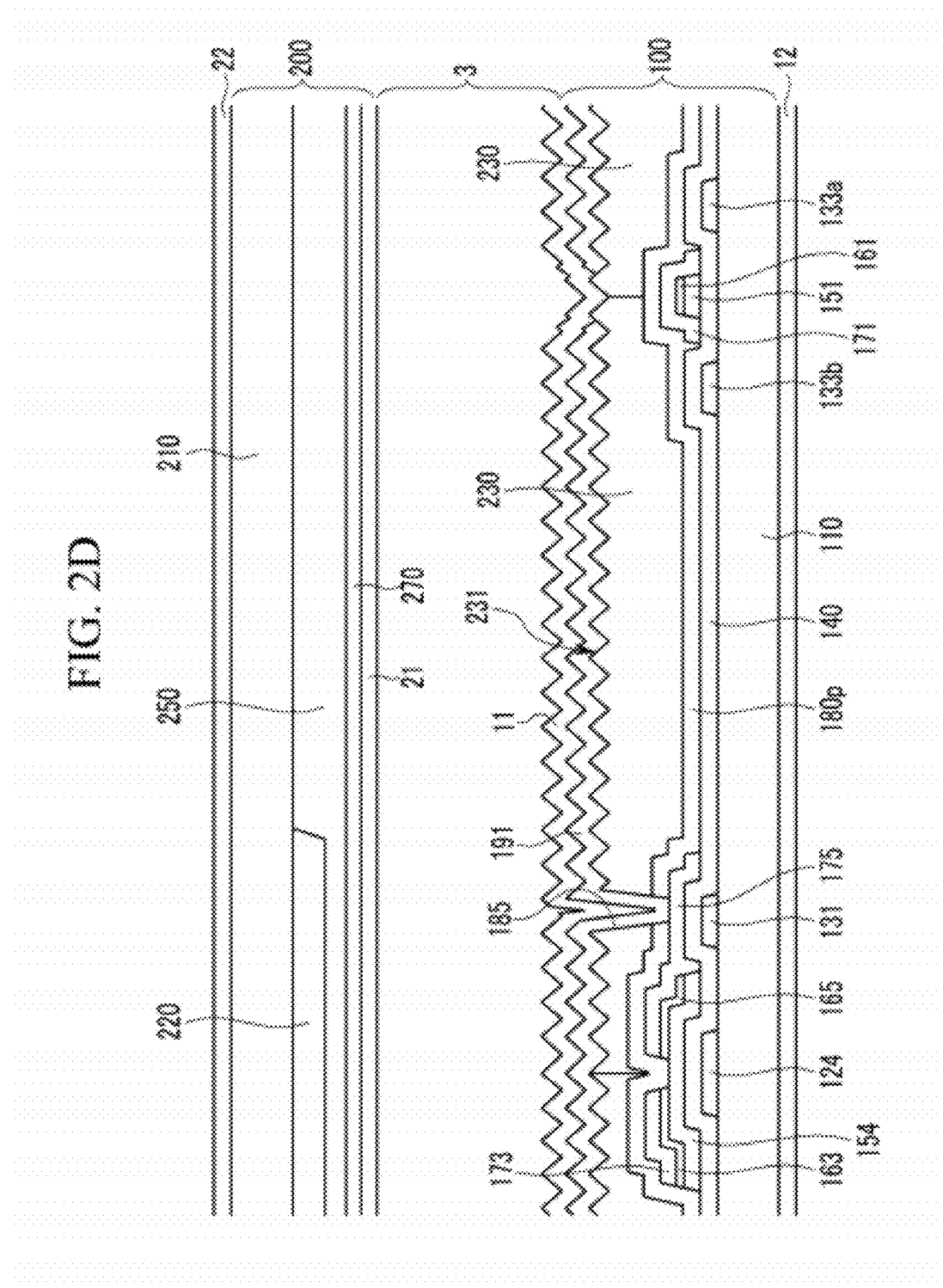

LIQUID CRYSTAL DISPLAY AND METHOD FOR MANUFACTURING THE SAME

This application claims priority to Korean Patent Application No. 10-2008-0115037, filed on Nov. 19, 2008, and all the benefits accruing therefrom under 35 U.S.C. §119, the contents of which in its entirety are herein incorporated by reference.

BACKGROUND OF THE INVENTION (a) Field of the Invention

The present invention relates to a liquid crystal display and a manufacturing method thereof.

(b) Description of the Related Art

A liquid crystal display ("LCD") is one of the most widely used types of flat panel displays ("FPD"), and it is typically composed of two display panels on which field generating electrodes are formed and a liquid crystal layer interposed between the two display panels. A voltage is applied to the field generating electrodes to generate an electric field within the liquid crystal layer, and the orientation of liquid crystal molecules of the liquid crystal layer is determined thereby and the polarization of incident light is controlled through the generated electric field to display an image.

The LCD having a structure in which pixel electrodes and a common electrode as the field generating electrodes are respectively formed on two opposite display panels is widely used. The LCD also typically includes color filters including pigments for realizing colors.

When the pixel electrodes and the color filters are formed on the different display panels, it is difficult to correctly align the pixel electrodes and the color filters, and therefore an alignment error may be generated. To solve this problem, a color filter on array ("CoA") structure in which the pixel electrodes and the color filters are formed on the same display panel has been presented.

In the CoA structure, the color filters, the pixel electrodes, a plurality of signal lines for applying the voltage to the pixel electrodes such as gate lines and data lines, and switching elements for driving them are formed on one display panel.

On the other hand, if a parasitic capacitance is generated between the various electrodes included in the liquid crystal display, the parasitic capacitance influences the electric field formed in liquid crystal layer and thereby the electric field may be deteriorated. Thus, the arrangement of the liquid crystal molecules is distorted such that the light incident from a backlight may leak therethrough. To prevent the light leakage, a light blocking member is formed on the corresponding portion. Here, the area of the light blocking member becomes wide to prevent the light leakage generated due to light coming through the display at a large angle of incidence, however the aperture ratio of the liquid crystal display is decreased.

BRIEF SUMMARY OF THE INVENTION

The present invention effectively prevents light leakage without expanding a light blocking member of a liquid crystal display ("LCD").

An exemplary embodiment of an LCD according to the present invention includes; a first substrate, a gate line and a data lien disposed on the first substrate, a color filter including protrusions and depressions aligned with the data line, the color filter being disposed on the data line, a pixel electrode disposed on the color filter, a second substrate facing the first substrate, a common electrode disposed on the second substrate, and a liquid crystal layer interposed between the first substrate and the second substrate, wherein the color filter aligned with the data line includes protrusions and depressions on a surface thereof.

In one exemplary embodiment, the protrusions and depressions may include a ridge and two inclined surfaces connected to one another via the ridge.

In one exemplary embodiment, angles between the two inclined surfaces and the first substrate may be substantially the same.

In one exemplary embodiment, the ridge may include a plurality of recessed portions.

In one exemplary embodiment, the LCD may further include; a gate insulating layer disposed on the gate line, a semiconductor layer disposed on the gate insulating layer, and a first passivation layer disposed between the data line and the color filter, wherein the gate line is disposed directly on the first substrate, and wherein the data line is disposed on the semiconductor layer.

In one exemplary embodiment, the ridge may be substantially parallel to the data line.

In one exemplary embodiment, the first passivation layer may include an inorganic insulating layer.

In one exemplary embodiment, the LCD may further include a second passivation layer disposed on the color filter.

In one exemplary embodiment, the second passivation layer may include an inorganic insulating layer.

In one exemplary embodiment, the second passivation layer may include an organic insulating layer.

In one exemplary embodiment, the second passivation layer may include an organic insulating layer disposed on the color filter, and an inorganic insulator disposed on the organic insulating layer.

In one exemplary embodiment, the pixel electrode may contact the color filter.

An exemplary embodiment of a manufacturing method of an LCD according to the present invention includes; disposing a gate conductor including a gate line on a substrate, disposing a gate insulating layer on the gate conductor, disposing a semiconductor layer on the gate insulating layer, disposing a data conductor including a data line on the semiconductor layer, disposing a first passivation layer on the data conductor, disposing a color filter including protrusions and depressions on the first passivation layer, and disposing a pixel electrode on the color filter.

In one exemplary embodiment, the disposing of the color filter may include; depositing a material including pigments on a printing plate, and pressing the material including the pigments to form the protrusions and depressions.

In one exemplary embodiment, the depositing of the material including the pigments may include; injecting the material including the pigments to the printing plate, wherein the printing plate includes a plurality of grooves, transcribing the material including the pigments injected to the grooves to a transcribing roller, and transcribing the material including the pigments on the first passivation layer.

In one exemplary embodiment, the protrusions and depressions may include a ridge and two inclined surfaces connected to each other via the ridge.

In one exemplary embodiment, the ridge may be substantially parallel to the data line.

In one exemplary embodiment, the ridge may include a plurality of recessed portions.

In one exemplary embodiment, the method may further include disposing a second passivation layer on the color filter.

In one exemplary embodiment, the second passivation layer may include an inorganic insulating layer.

In one exemplary embodiment, the second passivation layer may include an organic insulating layer.

In one exemplary embodiment, the second passivation layer may include an organic insulating layer and an inorganic insulating layer that are sequentially deposited.

According to the present invention, the color filter disposed on the lower panel includes protrusions and depressions such that the light may be condensed. Accordingly, the light leakage may be prevented without the expansion of the width of the light blocking member.

BRIEF DESCRIPTION OF THE DRAWINGS

The above and other aspects, advantages, and features of the invention will become more apparent by describing in further detail exemplary embodiments thereof with reference to the attached drawings, in which:

FIGS. 2A, 2B, 2C, and 2D are various examples of a cross-sectional view of the exemplary embodiment of an LCD shown in FIG. 1 taken along line II-II;

DETAILED DESCRIPTION OF THE INVENTION

Figure 1:
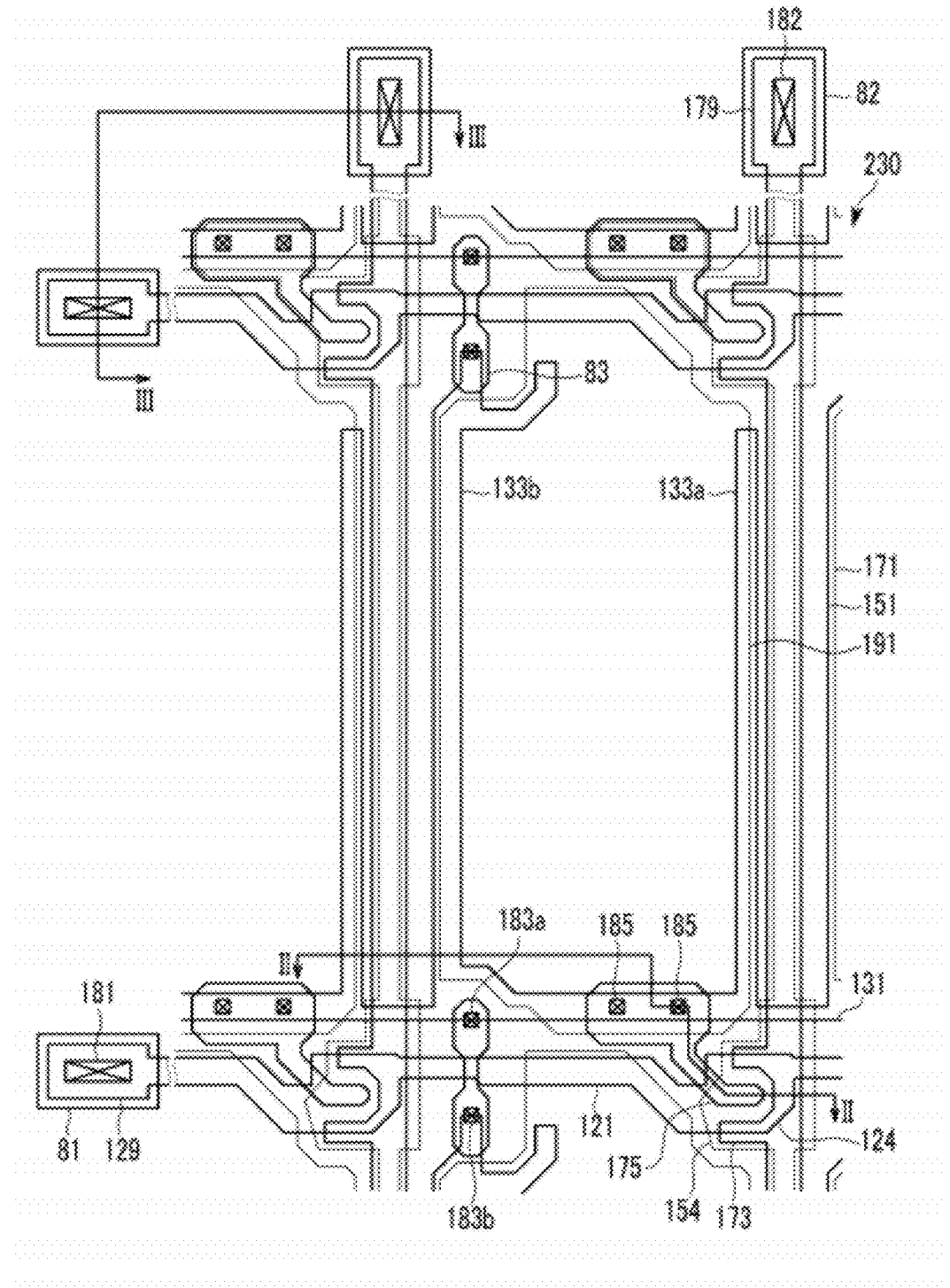
FIG. 1 is a top plan layout view of an exemplary embodiment of a liquid crystal display ("LCD") according to the present invention.

The invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout. As those skilled in the art would realize, the described embodiments may be modified in various different ways, all without departing from the spirit or scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

An exemplary embodiment of a liquid crystal display ("LCD") according to the present invention will be described with reference to FIG. 1 to FIG. 5B.

Figure 2A:
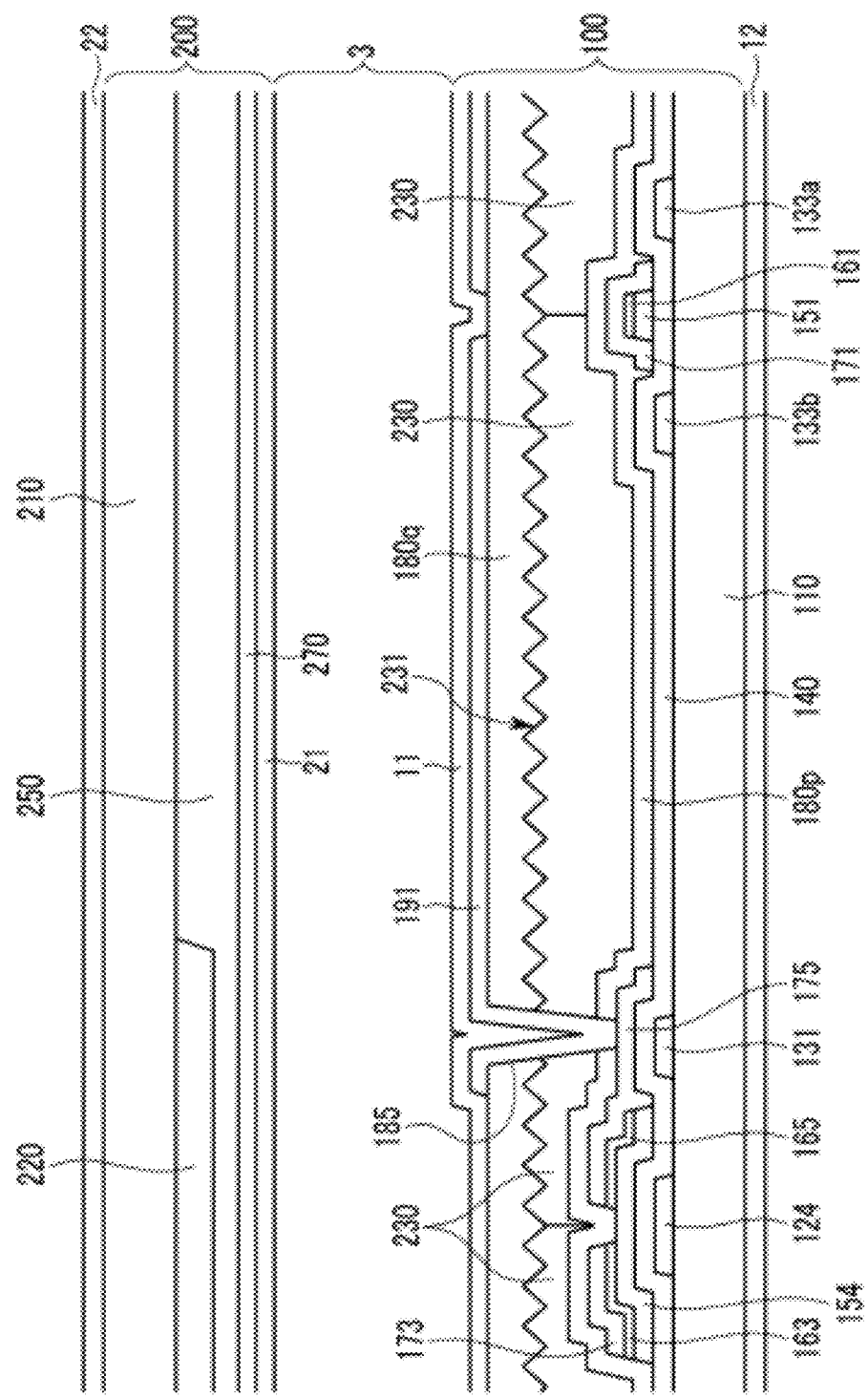
Figure 2B:
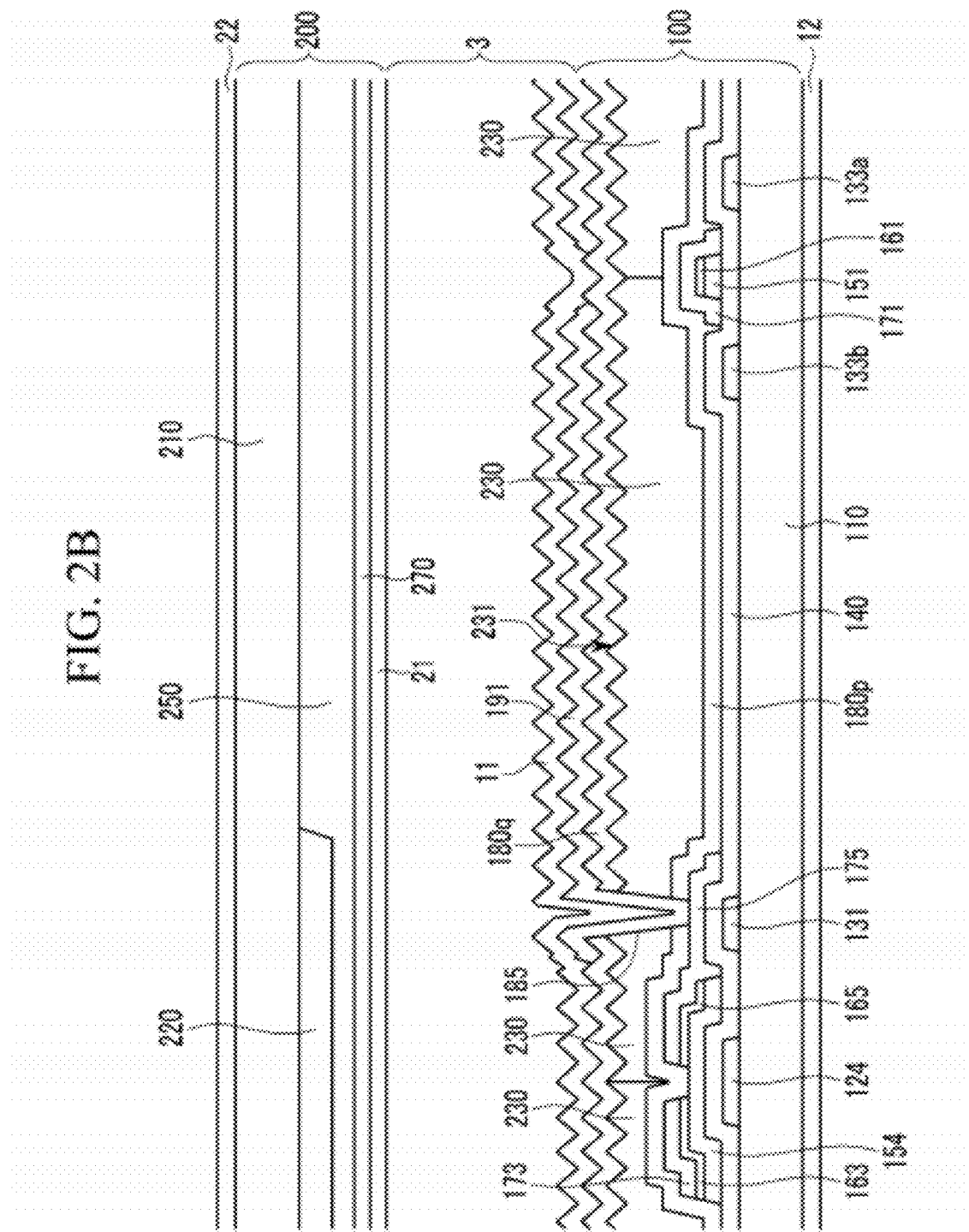
Figure 2C:
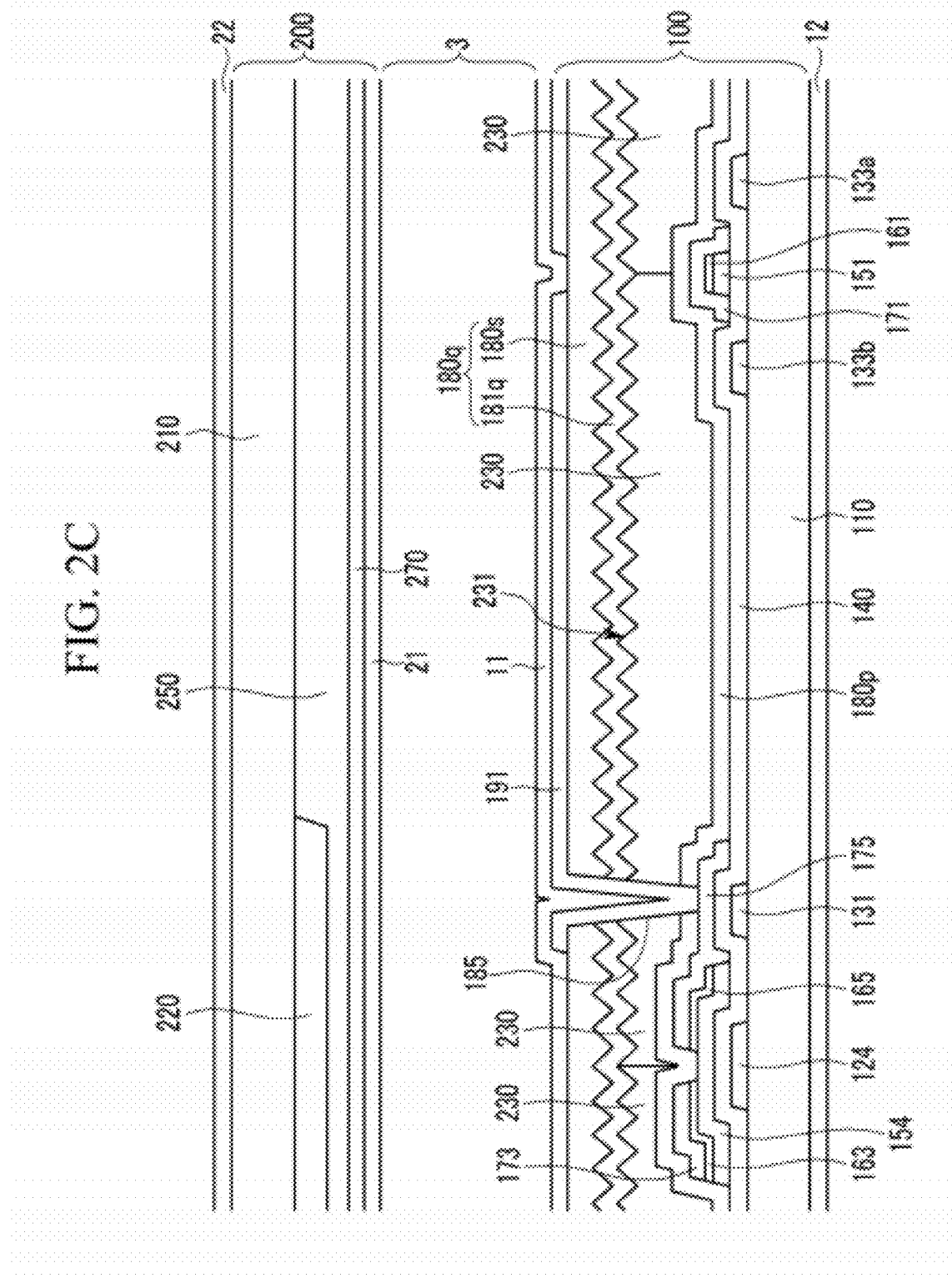
Figure 3:
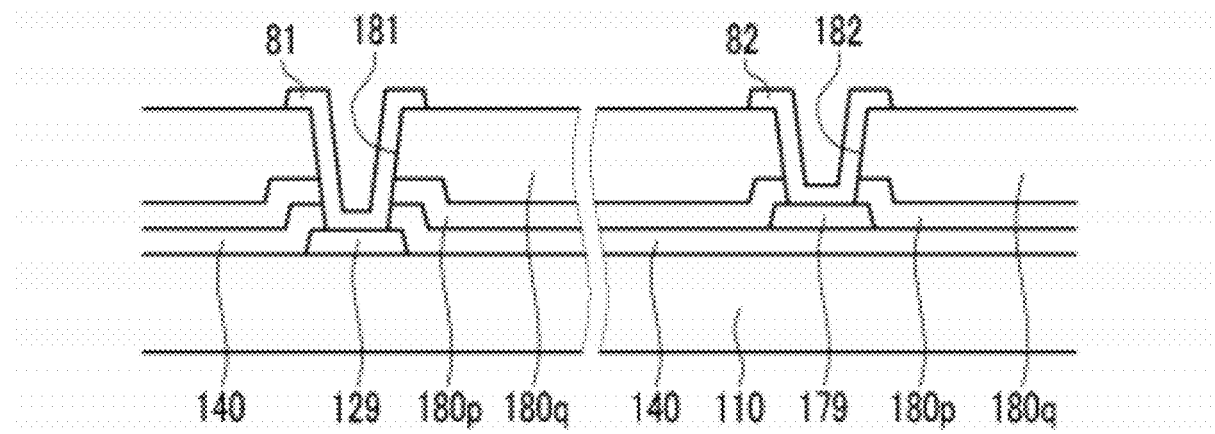
FIG. 3 is cross-sectional view of the exemplary embodiment of an LCD shown in FIG. 1 taken along line III-III.

FIG. 1 is a top plan layout view of an exemplary embodiment of an LCD according to an exemplary embodiment of the present invention, FIGS. 2A, 2B, 2C, and 2D are various examples of a cross-sectional view of the exemplary embodiment of an LCD shown in FIG. 1 taken along line II-II, and FIG. 3 is cross-sectional view of the exemplary embodiment of an LCD shown in FIG. 1 taken along line III-III.

Referring to FIG. 1 to FIG. 3, an exemplary embodiment of an LCD according to the present invention includes a lower panel 100 and a upper panel 200 facing each other, a liquid crystal layer 3 disposed between the two display panels 100 and 200, and a pair of polarizers 12 and 22 respectively attached on the outside surfaces of the display panels 100 and 200.

Firstly, the lower panel 100 will be described.

A plurality of gate lines 121 and a plurality of storage electrode lines 131 are formed on an insulation substrate 110, exemplary embodiments of which may be made of transparent glass, plastic, or other materials having similar characteristics.

The gate lines 121 transfer a gate signal and generally extend in a transverse direction. In the present exemplary embodiment, each gate line 121 includes a wide end portion 129 for connecting to other layers or an external driving circuit, and a plurality of gate electrodes 124 that are protruded upward therefrom.

A predetermined voltage is applied to the storage electrode lines 131, and in the present exemplary embodiment the storage electrode lines 131 include a stem that is substantially parallel to the gate lines 121 and a plurality of pairs of storage electrodes 133a and 133b that are extended from the stem. Each of the storage electrode lines 131 is positioned between two adjacent gate lines 121, and the stem is nearer the lower one of the two gate lines 121. In the present exemplary embodiment, each of the storage electrodes 133a and 133b has a fixed end that is connected to the branch line and a free end at the opposite side thereof. However, alternative exemplary embodiments include configurations wherein the shape and disposition of the storage electrode lines 131 may be variously changed.

A gate insulating layer 140, exemplary embodiments of which may be made of silicon nitride ("SiN$_x$"), silicon oxide ("SiOx"), or other materials with similar characteristics, is formed on the gate lines 121 and the storage electrode lines 131.

A plurality of semiconductor stripes 151, exemplary embodiments of which may be made of hydrogenated amorphous silicon (a-Si), polysilicon, or other materials with similar characteristics, are formed on the gate insulating layer 140. The semiconductor stripes 151 generally extend in a vertical direction and include a plurality of projections 154 that are extended toward the gate electrodes 124.

A plurality of ohmic contact stripes and islands 161 and 165 are formed on the semiconductor stripes 151. Exemplary embodiments of the ohmic contacts 161 and 165 may be made of a material such as n+ hydrogenated amorphous silicon in which an n-type impurity such as phosphorus (P) is doped with a high concentration, or of silicide, or of other materials with similar characteristics. The ohmic contact stripes 161 have a plurality of projections 163, and the projections 163 and the ohmic contact islands 165 form pairs disposed on the projections 154 of the semiconductors 151.

A plurality of data lines 171 and a plurality of drain electrodes 175 are formed on the ohmic contacts 161 and 165 and the gate insulating layer 140.

The data lines 171 transfer a data signal and generally extend in a vertical direction, thereby being disposed substantially perpendicular to the gate lines 121. Each data line 171 also is disposed substantially perpendicular to the storage electrode lines 131 and is formed between a set of adjacent storage electrodes 133a and 133b. In the present exemplary embodiment, each data line 171 includes a wide end portion 179 for connecting to other layers or an external driving circuit and a plurality of source electrodes 173 that are extended toward the gate electrodes 124. Alternative exemplary embodiments include configurations wherein either or both of the wide end portions 179 and 129 may be omitted and replaced with a direct connection to another layer or a driving apparatus.

The drain electrodes 175 are separated from the data lines 171 and are disposed opposite to the source electrodes 173 with respect to the gate electrode 124. In the present exemplary embodiment, each drain electrode 175 has one wide end portion and the other end portion having a bar shape. The wide end portion overlaps with a storage electrode line 131, and the bar-shaped end portion is surrounded with a source electrode 173 that is bent in a C-shape or a J shape. Alternative exemplary embodiments include configurations wherein the shapes of the source and drain electrodes may be variously modified.

One gate electrode 124, one source electrode 173, and one drain electrode 175, along with a projection 154 of a semiconductor 151 form one thin film transistor ("TFT"), and a channel of the TFT is formed in the projection 154 between the source electrode 173 and the drain electrode 175.

In the present exemplary embodiment, the ohmic contacts 161 and 165 exist only between the lower semiconductors 151 and the upper data lines 171 and drain electrodes 175, and lower contact resistance therebetween. The semiconductors 151 and 154 have a portion that is exposed without being covered by the data lines 171 and the drain electrodes 175, e.g., a portion between the source electrodes 173 and the drain electrodes 175.

A first passivation layer 180p is formed on the data lines 171, the drain electrodes 175, and the exposed portions of the semiconductors 151 and 154. In one exemplary embodiment, the first passivation layer 180p may be made of an inorganic insulator. Exemplary embodiments of the inorganic insulator may include silicon nitride, silicon oxide, combinations thereof, or other materials with similar characteristics.

A plurality of color filters 230 is formed on the first passivation layer 180p. The color filters 230 are disposed between the gate lines 121 and the data lines 171 within an individual pixel. Each of the color filters 230 may display one of primary colors such as three primary colors of red, green, and blue. In one exemplary embodiment, the color filters 230 may be made of a material including pigments. In one exemplary embodiment the pigments may be organic pigments.

In the present exemplary embodiment, the surface of the color filters 230 includes protrusions and depressions 231.

Next, the color filters of the exemplary embodiment of an LCD according to the present invention will be described with reference to FIG. 4A and FIG. 4B.

Figure 4A:
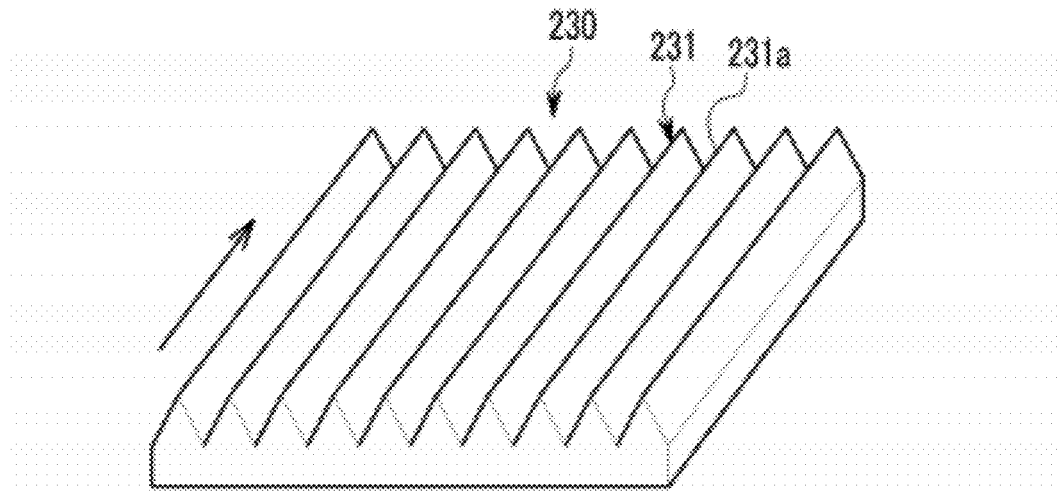
FIG. 4A is a front perspective view illustrating an exemplary embodiment of a color filter of an exemplary embodiment of an LCD according to the present invention.
Figure 4B:
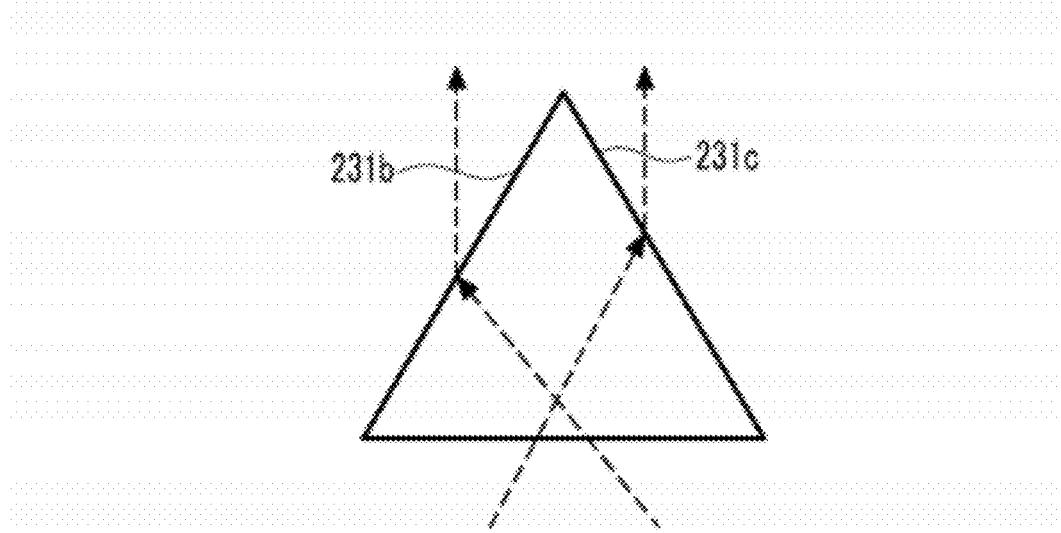
FIG. 4B is a schematic view illustrating a portion of the exemplary embodiment of a color filter shown in FIG. 4A.

FIG. 4A is a front perspective view illustrating an exemplary embodiment of a color filter of an exemplary embodiment of an LCD according to the present invention, and FIG. 4B is a schematic view illustrating a portion of the exemplary embodiment of a color filter shown in FIG. 4A.

Referring to FIG. 4A and FIG. 4B, the protrusions and depressions 231 of the color filter 230 according to an exemplary embodiment of the present invention have a prism shape including a ridge 231a. In the present exemplary embodiment, the ridge 231a is substantially parallel to the data lines 171. Alternative exemplary embodiments include configurations wherein the ridge 231a may be disposed substantially parallel to the gate lines 121. The protrusions and depressions 231 include two neighboring inclined surfaces 231b and 231c. In the present exemplary embodiment, the two inclined surfaces 231b and 231c have substantially the same inclination angle with respect to the substrate 110. When the light is obliquely incident to the color filter 230, as shown by a dotted line in FIG. 4B, and passes through the inclination surfaces of the inclined surfaces 231b and 231c of the protrusions and depressions 231 of the color filter 230, the path of the light is changed to be close to the vertical direction with respect to the substrate 110. Accordingly, the light having passed through the color filter 230 is concentrated compared with the light before passing through the color filter 230.

Next, another exemplary embodiment of the color filter of the LCD according to the present invention will be described with reference to FIG. 5A and FIG. 5B.

Figure 5A:
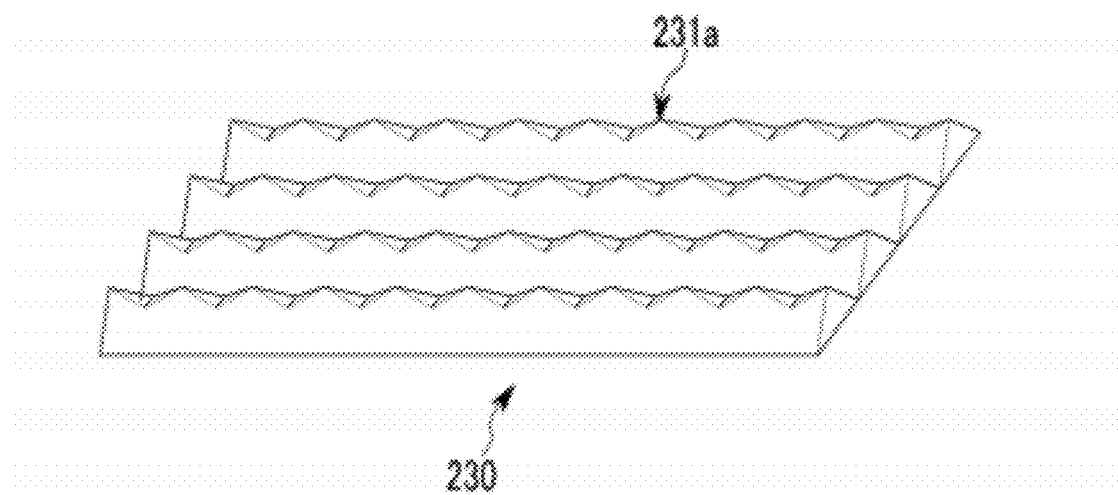
FIG. 5A is a front perspective view illustrating a color filter of another exemplary embodiment of an LCD according to the present invention.
Figure 5B:
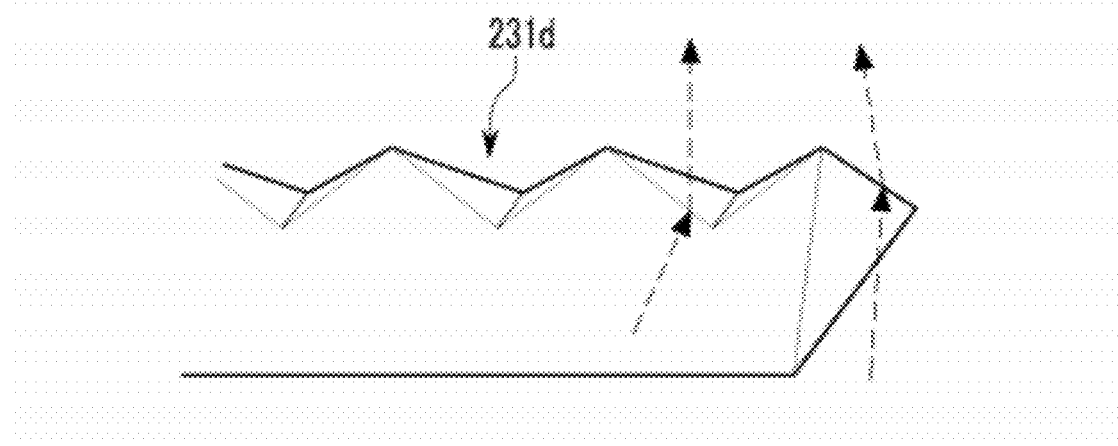
FIG. 5B is an enlarged front perspective view of the exemplary embodiment of a color filter shown in FIG. 5A.

Referring to FIG. 5A, according to another exemplary embodiment of the present invention a plurality of recess portions 231d are formed in the ridge 231a of the protrusions and depressions 231 of the color filter 230. Accordingly, light having various incident angles may be more effectively concentrated into a direction substantially normal with respect to an exiting surface of the substrate 110.

Again referring to FIG. 1, FIG. 2A, and FIG. 3, a second passivation layer 180q is formed on the color filter 230. Exemplary embodiments of the second passivation layer 180q may be made of an organic insulator and may have a flat surface. In the present exemplary embodiment, the organic insulator has photosensitivity, and the dielectric constant thereof is less than about 4.0.

Alternative exemplary embodiments, as in FIG. 2B, include configurations wherein the second passivation layer 180q may be made of an inorganic insulator. In such an alternative exemplary embodiment, the second passivation layer 180q is disposed on the portion overlapping the color filter 230 and is contoured to the protrusions and the depressions 231 of the color filter 230.

Also, as in FIG. 2C, the second passivation layer 180q may include a lower layer 181q including an inorganic insulator and an upper layer 180s including an organic insulator.

The color filters 230 and the first and second passivation layers 180p and 180q have a plurality of contact holes 182 and 185 exposing the end portions 179 of the data lines 171, and the drain electrodes 175, and the color filters 230, the first and second passivation layers 180p and 180q, and the gate insulating layer 140 have a plurality of contact holes 181 exposing the end portions 129 of the gate lines 121, a plurality of contact holes 183a exposing a portion of the storage electrode line 131 adjacent to the fixed portion of the storage electrode 133b, and a plurality of contact holes 183b exposing a free portion of the storage electrode 133a.

A plurality of pixel electrodes 191, a plurality of overpasses 83 and a plurality of contact assistants 81 and 82 are formed on the second passivation layer 180q.

However, as shown in the exemplary embodiment of FIG. 2D, the second passivation layer 180q may be omitted and the pixel electrode 191 may be formed directly on the color filter 230. In such an exemplary embodiment, the pixel electrodes 191 may be contoured according to the protrusions and depressions 231 of the color filter 230.

The pixel electrodes 191 are physically and electrically connected to the drain electrodes 175 through the contact holes 185, and receive a data voltage from the drain electrodes 175. The pixel electrodes 191, to which a data voltage is applied, and a common electrode 270 of the upper panel 200, which receives a common voltage, generate an electric field, thereby determining a direction of liquid crystal molecules of a liquid crystal layer 3 disposed between the two electrodes. Thus, the polarization of the light passing through the liquid crystal layer is changed according to the direction of orientation of the liquid crystal molecules. The pixel electrodes 191, the common electrode 270 and the liquid crystal layer 3 form a capacitor (hereinafter, referred to as a "liquid crystal capacitor"), and an applied voltage is sustained even after the TFT is turned off.

The pixel electrodes 191 overlap the storage electrode lines 131 and the storage electrodes 133a and 133b. A capacitor that is formed where a pixel electrode 191 and a drain electrode 175 that is electrically connected thereto overlap a storage electrode line 131 is called a storage capacitor, and the storage capacitor enhances the voltage sustaining ability of a liquid crystal capacitor.

The contact assistants 81 and 82 are connected to the end parts 129 of the gate lines 121 and the end parts 179 of the data lines 171 through the contact holes 181 and 182. The contact assistants 81 and 82 increase adhesion between the end parts 179 and 129 of the data lines 171 and the gate lines 121 and an external apparatus, and protect them, e.g., from abrasion, etc.

The overpasses 83 cross the gate lines 121 and are connected to exposed portions of the storage electrode lines 131 and exposed end parts of the free ends of the storage electrodes 133b through contact holes 183a and 183b that are positioned at opposite sides of the overpasses 83 with the gate lines 121 interposed therebetween. The storage electrodes 133a and 133b and the storage electrode lines 131 along with the overpasses 83 can be used in repairing a defect of the gate lines 121, the data lines 171, or the TFTs.

Next, the upper panel 200 will be described.

Light blocking members 220 are formed on a substrate 210. The light blocking members 220 have a plurality of openings facing the pixel electrodes 191, and they block light leakage between adjacent pixel electrodes 191.

An overcoat 250 is formed on the light blocking members 220. Exemplary embodiments of the overcoat 250 may be made of the insulating material, and provides a flat surface for the disposition of the common electrode 270.

A common electrode 270 is formed on the overcoat 250. In one exemplary embodiment, the common electrode 270 is made of the transparent conductor, exemplary embodiments of which include indium tin oxide ("ITO"), indium zinc oxide ("IZO"), combinations thereof, or other materials having similar characteristics.

Alignment layers 11 and 21 are formed on insides of the TFT array panel 100 and the common electrode panel 200, respectively.

Now, an exemplary embodiment of a method of manufacturing the lower panel shown in FIG. 1, FIG. 2A, and FIG. 3 will be described with reference to FIG. 6 to FIG. 8D.

Figure 6:
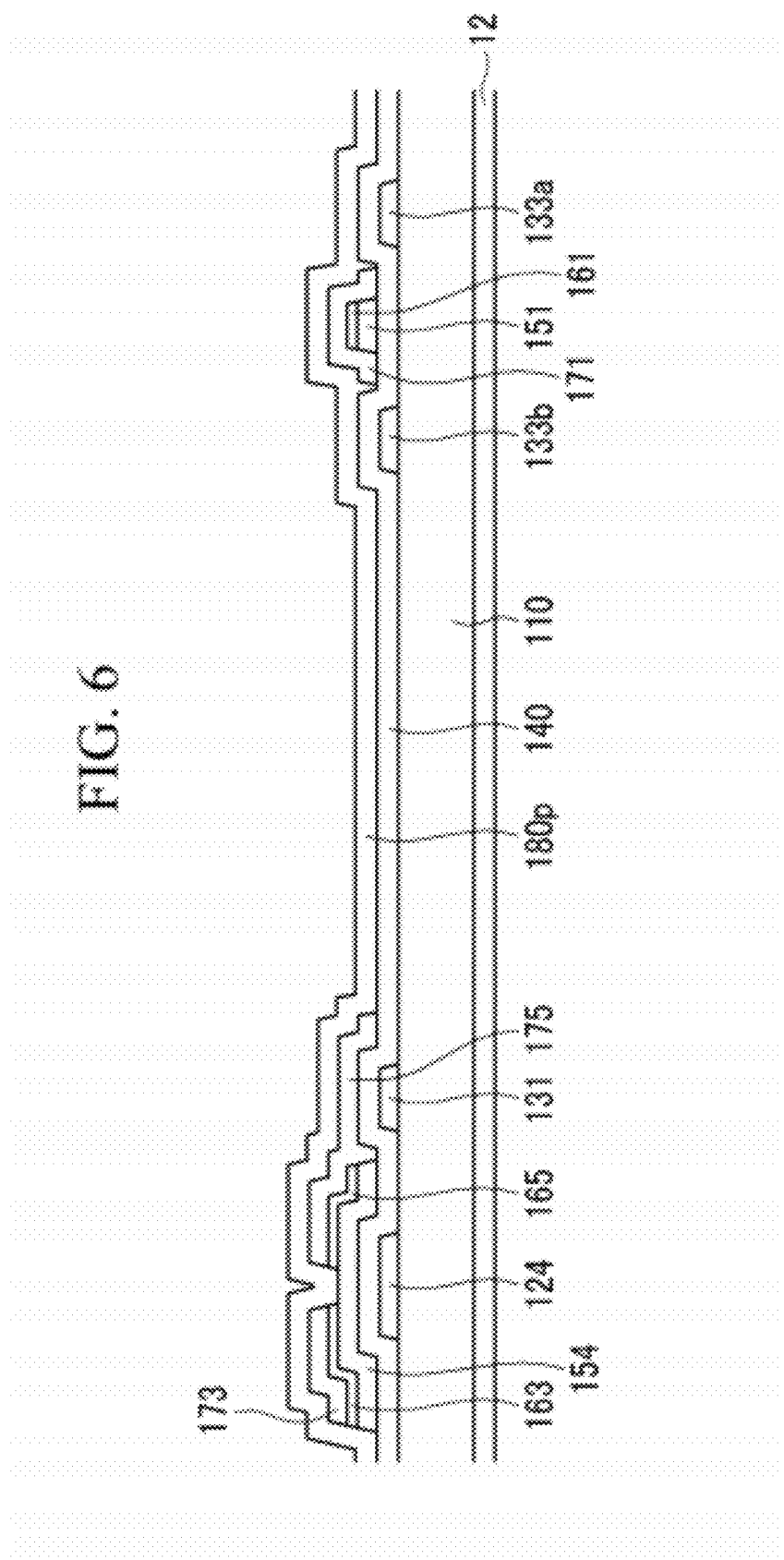
FIG. 6 and FIG. 7 are cross-sectional views illustrating intermediate steps in an exemplary embodiment of a manufacturing method of a lower panel in the exemplary embodiment of an LCD shown in FIG. 1, FIG. 2A, and FIG. 3 according to the present invention.
Figure 7:
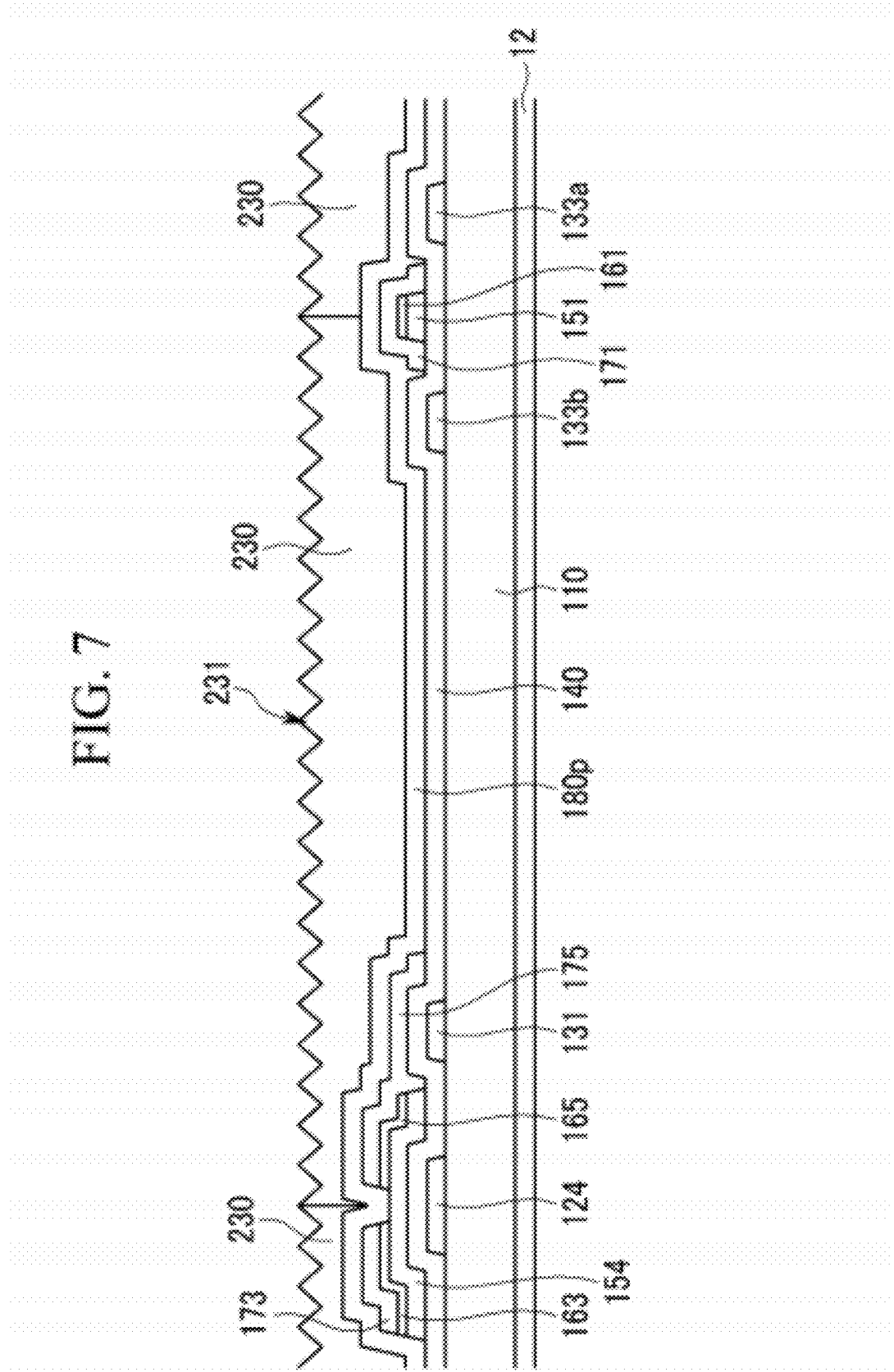

FIG. 6 and FIG. 7 are cross-sectional views illustrating intermediate steps in an exemplary embodiment of a manufacturing method of a lower panel in the LCD shown in FIG. 1, FIG. 2A, and FIG. 3 according to the present invention.

Referring to FIG. 6, a gate insulating layer, an intrinsic amorphous silicon layer, and an extrinsic amorphous silicon layer are sequentially stacked, and the overlying two are patterned to form a plurality of impurity semiconductor stripes and a plurality of extrinsic semiconductor stripes 151 including protrusions 154.

Next, a metal layer is deposited, e.g., by sputtering, and is patterned, e.g., by photolithography, to form a plurality of data lines 171 including source electrodes 173 and an end portion 179, and a plurality of drain electrodes 175.

Next, the impurity semiconductors that are not covered by the data lines 171 and the drain electrodes 175 are removed to form a plurality of ohmic contact stripes 161 including projections 163 and a plurality of ohmic contact islands 165, and to expose the intrinsic semiconductor stripes 151 disposed therebetween. In one exemplary embodiment, in order to stabilize a surface of the exposed portions of the intrinsic semiconductor stripes 151, oxygen ($O_2$) plasma bombardment may be executed.

Next, an inorganic insulator is deposited, e.g., by chemical vapor deposition, to form the first passivation layer 180p.

Next, as in FIG. 7, a color filter 230 is formed on the first passivation layer 180p.

Next, as in FIG. 2A, the second passivation layer 180q including an organic insulator is formed on the color filter 230. Then, the color filter 230, the first and second passivation layers 180p and 180q, and the gate insulating layer 140 are patterned to form contact holes 181, 182, and 185.

Next, a transparent conductive layer, e.g., an ITO layer or an IZO layer, is deposited, e.g., by sputtering, and patterned, e.g., by photolithography, to form a plurality of pixel electrodes 191 and a plurality of contact assistants 81 and 82. Next, the alignment layers 11 and 21 may be formed.

Next, another exemplary embodiment of a manufacturing method of a color filter of a lower panel in the exemplary embodiment of an LCD according to the present invention will be described with reference to FIG. 8A to FIG. 8E.

FIG. 8A to FIG. 8E are schematic views showing an exemplary embodiment of a manufacturing method of an exemplary embodiment of a color filter of a lower panel in the exemplary embodiment of an LCD shown in FIG. 1, FIG. 2A, and FIG. 3 according to the present invention.

Figure 8A:
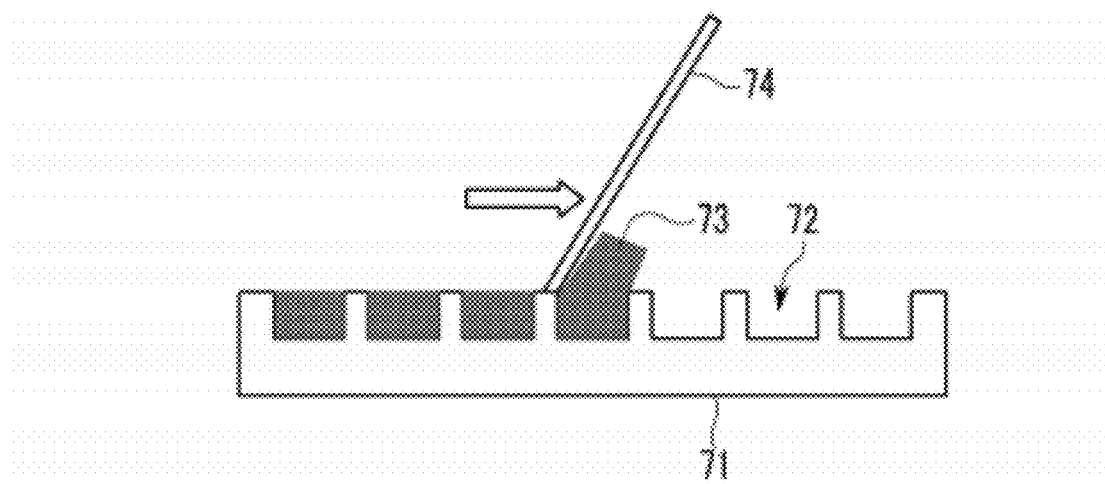
FIG. 8A to FIG. 8E are views showing an exemplary embodiment of a manufacturing method of a color filter of a lower panel in the exemplary embodiment of an LCD shown in FIG. 1, FIG. 2A, and FIG. 3 according to the present invention.

Firstly, referring to FIG. 8A, a material 73 including pigments is injected to a printing plate 71 including a plurality of grooves 72. Next, the upper portion of the printing plate 71 is pushed using a blade 74 to inject the material 73 including the pigments to the grooves 72 of the printing plate 71. Here, each groove 72 corresponds to the color filter 230 formed in one pixel surrounded by the data line 171 and the gate line 121. In the present exemplary embodiment, the blade 74 wipes the material 73 from one groove 72 to a next adjacent groove 72.

Figure 8B:
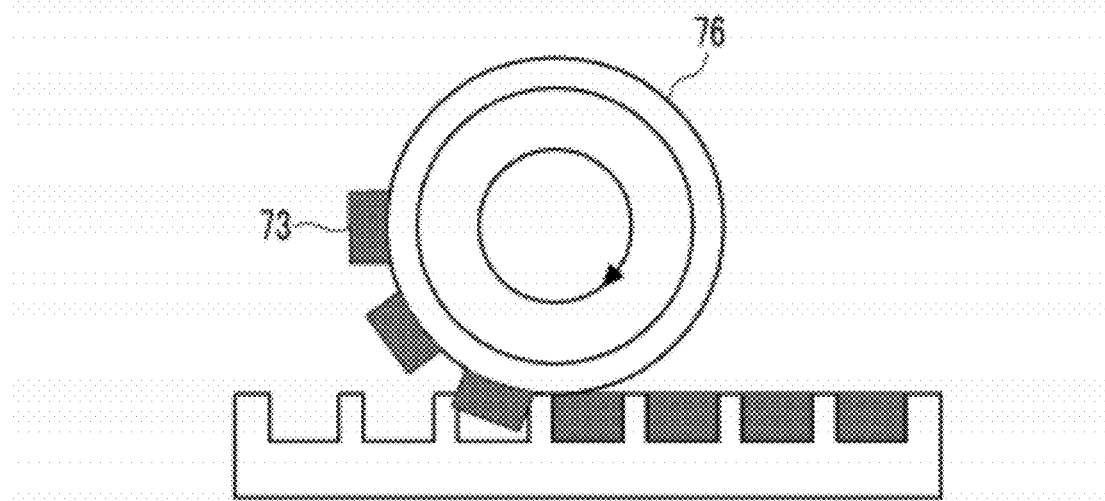

Next, as shown in FIG. 8B, a transcribing roller 76 is rolled on the printing plate 71, and the material 73 including the pigment that is injected to the groove 72 is transcribed to the surface of the transcribing roller 76. Here, the material 73 including the pigments that is transcribed to the surface of the transcribing roller 76 has substantially the same interval as the interval between the grooves 72.

Figure 8C:
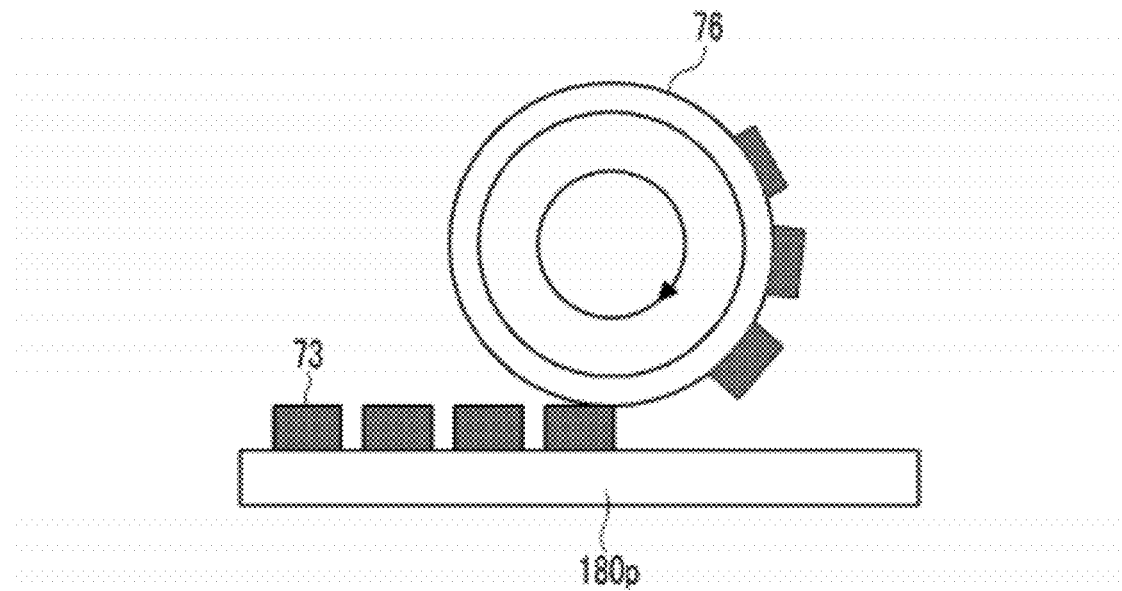

Next, as shown in FIG. 8C, the transcribing roller 76 is moved onto the first passivation layer 180p, and the material 73 including the pigments is transcribed onto the first passivation layer 180p. Thus, the material 73 including the pigments is formed on the first passivation layer 180p at substantially uniform intervals, e.g., the intervals between the grooves 72 of the printing plate 71.

Figure 8D:
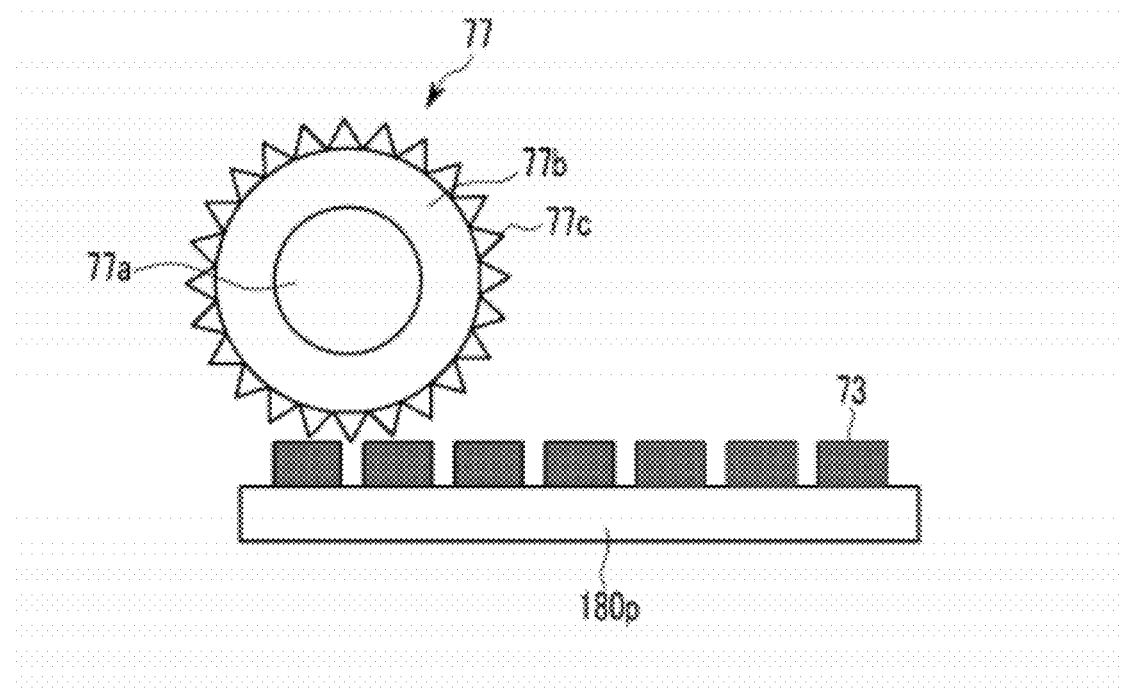

Next, as shown in FIG. 8D, the material 73 including the pigments that is attached on the first passivation layer 180p is pressed by a pressing roller 77. The pressing roller 77 includes a central axis 77a, a supporting portion 77b attached to the central axis 77a, and a pressing portion 77c attached to the supporting portion 77b. The pressing portion 77c includes protrusions and depressions, and the surface of the material 73 including the pigments attached to the first passivation layer 180p is formed to have protrusions and depressions according to the shape of the protrusions and depressions of the pressing portion 77c, e.g., it includes an inverse pattern.

Figure 8E:
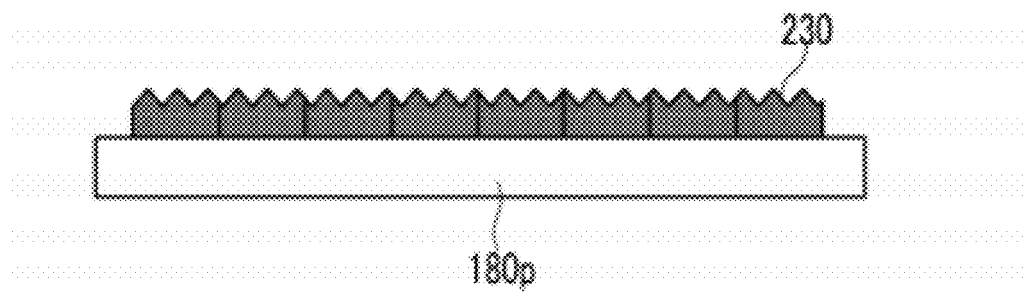

Thereby, referring to FIG. 8E, a color filter 230 including protrusions and depressions 231 is formed on the first passivation layer 180p. Also, after pressing the material 73 including the pigments attached to the first passivation layer 180p by the pressing roller 77, the material 73 including the pigments is in continuous contact with the underlying layers and thereby the color filter 230 is formed as in FIG. 8E.

Next, the effect of the present invention will be described with reference to FIG. 9A to FIG. 10.

Figure 9A:
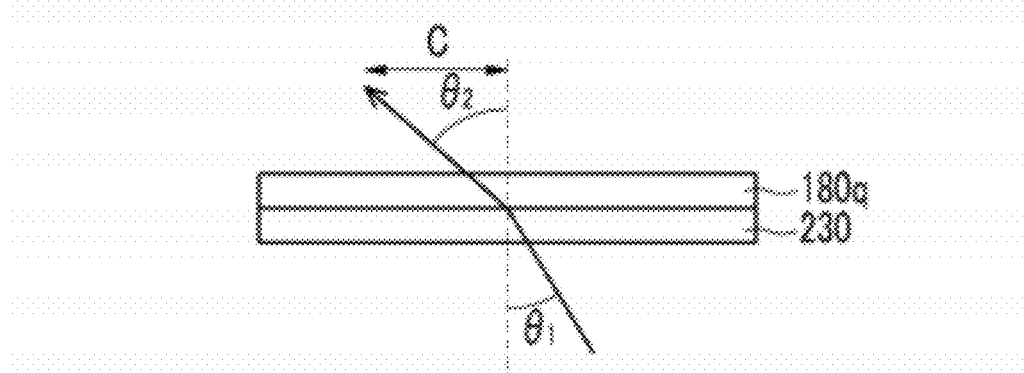
FIG. 9A is a schematic view illustrating a path of light passing through a color filter and a passivation layer in a comparative LCD.
Figure 9B:
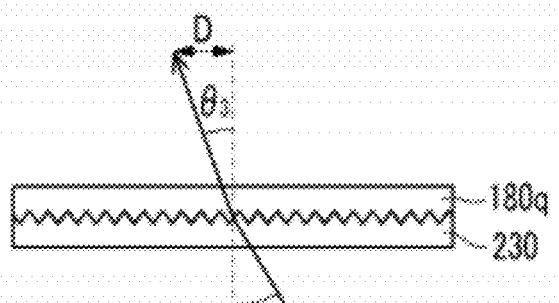
FIG. 9B is a schematic view illustrating a path of the light passing through a color filter and a passivation layer in an exemplary embodiment of an LCD of the present invention.
Figure 10:
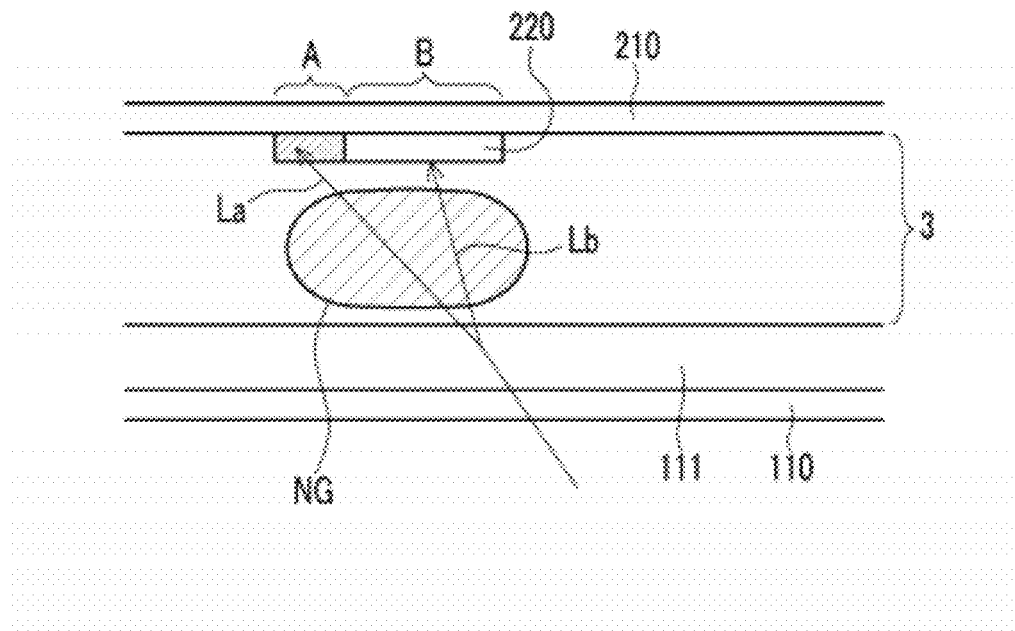
FIG. 10 is a cross-sectional illustrating an exemplary embodiment of an LCD of the present invention and a path of the light therethrough.

FIG. 9A is a schematic view illustrating a path of the light passing through a color filter and a passivation layer in a comparative LCD, FIG. 9B is a schematic view illustrating a path of the light passing through a color filter and a passivation layer in an exemplary embodiment of an LCD according to the present invention, and FIG. 10 is a cross-sectional illustrating an exemplary embodiment of an LCD according to he present invention and a path of the light therethrough.

Referring to FIG. 9A, in the comparative LCD, the incident light having an incident angle θ1 is output after passing through the color filter 230 and the second passivation layer 180q with an output angle θ2.

Referring to FIG. 9B, in the exemplary embodiment of an LCD according to the present invention, the incident light having the same incident angle θ1 as in FIG. 9A is output after passing through the color filter 230 and the second passivation layer 180q with an output angle θ3. In FIG. 9B, the light having the same incident angle θ1 as in FIG. 9A is incident, however the path of the light is curved close to the longitudinal central line indicated by a dotted line due to the protrusions and depressions 231 of the color filter 230 such that the output angle θ3 thereof becomes smaller than the output angle θ2 of FIG. 9A, and therefore a greater amount of light is concentrated in a direction substantially normal to an output face of the substrate 110.

Next, Table 1 shows a difference between the output angles according to the various incident angles and the longitudinal central portion in the comparative LCD and the exemplary embodiment of an LCD according to the present invention.

TABLE 1

| Incident angle (°) | Output angle (°) | | Distance from the longitudinal central line (μm) | | Reduction rate of the light blocking member of the present invention (%) |
| --- | --- | --- | --- | --- | --- |
| | comparative LCD | present invention | comparative LCD (C) | present invention (D) | |
| 45 | 65.4 | 43.6 | 8.7 | 3.8 | 56.3 |
| 40 | 55.7 | 37.1 | 5.8 | 3.0 | 48.3 |
| 35 | 47.5 | 30.6 | 4.3 | 2.4 | 44.2 |
| 30 | 40   | 23.9 | 3.4 | 1.8 | 47.0 |
| 25 | 32.9 | 17.1 | 2.6 | 1.2 | 53.8 |

In Table 1, the refractive index of the color filter 230 is 1.7, the refractive index of the second passivation layer 180$q$ is 1.4, the thickness of the liquid crystal layer 3 is 4 μm, and the angles between the inclined surfaces 231$b$ and 231$c$ of the color filter 230 in the exemplary embodiment of an LCD according to the present invention and the substrate 110 are 60°. Also, in Table 1, the distance from the longitudinal central line is a distance measured from a portion where the light that arrives from the longitudinal central line on the imaginary transverse line uniformly departs from the second passivation layer 180$q$, and the length is represented as C in FIG. 9A in the conventional art and the length is represented as D in the present invention.

Referring to Table 1, in the exemplary embodiment of an LCD according to the present invention, the output angles are reduced at the various incident angles compared with the comparative LCD. Also, the distance D from the longitudinal central line is greatly reduced according to the reduction of the output angle in the exemplary embodiment of an LCD according to the present invention compared with the distance C from the longitudinal central line in the comparative LCD.

Referring to FIG. 10, an exemplary embodiment of an LCD according to the present invention includes a lower substrate 110 and an upper substrate 210 facing each other, and a liquid crystal layer 3 including a portion NG that is abnormally arranged. A thin film pattern 111 is formed on the lower substrate 110, and the thin film pattern 111 includes a gate conductor, a gate insulating layer, a semiconductor, a data insulating layer, a color filter, a passivation layer, and a pixel electrode, as above-described.

In FIG. 10, the path of the light in the comparative LCD is indicated by La, and the path of the light in the exemplary embodiment of an LCD according to the present invention is indicated by Lb. The path the light progresses in the comparative LCD such that the width of the light blocking member 220 must be formed to include the portion A+B to prevent the light leakage in the abnormal arrangement portion NG. Contrarily, the light according to the exemplary embodiment of the present invention is more condensed and progresses according to the line Lb compared with the comparative LCD such that the light leakage in the abnormal arrangement portion NG may be prevented even though the width of the light blocking member 220 is only formed to include the portion B. Accordingly, the area of the light blocking member 220 may be reduced in the exemplary embodiment of an LCD according to the present invention compared with the comparative LCD such that the aperture ratio of the LCD is increased.

Referring to Table 1, the width of the light blocking member in the exemplary embodiment of an LCD according to the present invention is reduced more than the width of the light blocking member in the comparative LCD under the various incident angles.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display comprising:
    a first substrate;
    a gate line and a data line disposed on the first substrate;
    a color filter including protrusions and depressions aligned with the data line, the color filter being disposed on the data line;
    a pixel electrode disposed on the color filter;
    a second substrate facing the first substrate;
    a common electrode disposed on the second substrate; and
    a liquid crystal layer interposed between the first substrate and the second substrate,
    wherein the protrusions and depressions comprise two inclined surfaces relative to the first substrate having respective ends directly connected to one another defining a ridge.

2. The liquid crystal display of claim 1, wherein angles between the two inclined surfaces and the first substrate are substantially the same.

3. The liquid crystal display of claim 1, wherein the ridge comprises a plurality of recessed portions.

4. The liquid crystal display of claim 1, further comprising:
    a gate insulating layer disposed on the gate line;
    a semiconductor layer disposed on the gate insulating layer; and
    a first passivation layer disposed between the data line and the color filter,
    wherein the gate line is disposed directly on the first substrate, and
    wherein the data line is disposed on the semiconductor layer.

5. The liquid crystal display of claim 4, wherein the ridge is substantially parallel to the data line.

6. The liquid crystal display of claim 4, wherein the first passivation layer comprises an inorganic insulating layer.

7. The liquid crystal display of claim 4, further comprising a second passivation layer disposed on the color filter.

8. The liquid crystal display of claim 7, wherein the second passivation layer comprises an inorganic insulating layer.

9. The liquid crystal display of claim 7, wherein the second passivation layer comprises an organic insulating layer.

10. The liquid crystal display of claim 7, wherein the second passivation layer comprises an organic insulating layer disposed on the color filter and an inorganic insulator disposed on the organic insulating layer.

11. The liquid crystal display of claim 1, wherein the pixel electrode contacts the color filter.

12. The liquid crystal display of claim 1, wherein the liquid crystal display is a transmissive type of liquid crystal display.

13. A liquid crystal display comprising:
- a first substrate;
- a gate line and a data line disposed on the first substrate;
- a color filter including ridges and depressions aligned with the gate line, the color filter being disposed on the data line;
- a pixel electrode disposed on the color filter;
- a second substrate facing the first substrate;
- a common electrode disposed on the second substrate; and
- a liquid crystal layer interposed between the first substrate and the second substrate,
- wherein the depressions comprise a ridge of each of the ridges and two inclined surfaces relative to the first substrate directly connected to one another defining the ridge.

14. The liquid crystal display of claim 13, wherein the ridges are substantially parallel to the gate line.

15. A method for manufacturing a liquid crystal display, comprising:
- disposing a gate conductor comprising a gate line on a substrate;
- disposing a gate insulating layer on the gate conductor;
- disposing a semiconductor layer on the gate insulating layer;
- disposing a data conductor comprising a data line on the semiconductor layer;
- disposing a first passivation layer on the data conductor;
- disposing a color filter comprising protrusions and depressions on the first passivation layer; and
- disposing a pixel electrode on the color filter,
- wherein the protrusions and depressions comprise two inclined surfaces relative to the substrate having respective ends directly connected to one another defining a ridge.

16. The method of claim 15, wherein the disposing of the color filter comprises:
- depositing a material including pigments on a printing plate, and
- pressing the material comprising the pigments to form the protrusions and depressions.

17. The method of claim 16, wherein the depositing of the material comprising the pigments includes: injecting the material comprising the pigments to the printing plate, wherein the printing plate includes a plurality of grooves,
- transcribing the material comprising the pigments injected to the grooves to a transcribing roller, and
- transcribing the material comprising the pigments to the first passivation layer.

18. The method of claim 16, wherein the protrusions and depressions comprise a ridge and two inclined surfaces connected to each other via the ridge.

19. The method of claim 18, wherein the ridge is substantially parallel to the data line.

20. The method of claim 18, wherein the ridge comprises a plurality of recessed portions.

21. The method of claim 15, further comprising disposing a second passivation layer on the color filter.

22. The method of claim 21, wherein the second passivation layer comprises an inorganic insulating layer.

23. The method of claim 21, wherein the second passivation layer comprises an organic insulating layer.

24. The method of claim 21, wherein the second passivation layer comprises an organic insulating layer and an inorganic insulating layer that are sequentially deposited.

* * * * *